US007786676B2

(12) United States Patent

Cheng et al.

(10) Patent No.: US 7,786,676 B2
(45) Date of Patent: Aug. 31, 2010

(54) LED DRIVER STRUCTURE

(75) Inventors: Ying-Chang Cheng, Taipei Hsien (TW); Shih-Hung Liu, Taipei Hsien (TW)

(73) Assignee: Zippy Technology Corp., Hsin-Tien, Taipei Hsien (TW)

( * ) Notice: Subject to any disclaimer, the term of this patent is extended or adjusted under 35 U.S.C. 154(b) by 340 days.

(21) Appl. No.: 12/106,157

(22) Filed: Apr. 18, 2008

(65) Prior Publication Data

US 2009/0261740 A1 Oct. 22, 2009

(51) Int. Cl.
*H01J 7/44* (2006.01)
*H01L 41/00* (2006.01)

(52) U.S. Cl. .................... 315/55; 315/209 PZ; 310/314

(58) Field of Classification Search ................... 315/55, 315/209 PZ, 291, 307, 308, 309, 312; 363/65; 310/311, 314
See application file for complete search history.

(56) References Cited

U.S. PATENT DOCUMENTS

| | | | | |
|---|---|---|---|---|
| 6,075,325 | A * | 6/2000 | Kouno et al. | 315/307 |
| 6,281,637 | B1 * | 8/2001 | Asada | 315/209 PZ |
| 7,012,578 | B2 * | 3/2006 | Nakatsuka et al. | 345/52 |
| 7,038,354 | B2 * | 5/2006 | Takeda et al. | 310/316.01 |
| 7,145,281 | B2 * | 12/2006 | Takeda et al. | 310/316.01 |
| 7,385,333 | B2 * | 6/2008 | Chou et al. | 310/318 |

FOREIGN PATENT DOCUMENTS

| | | |
|---|---|---|
| TW | M298538 | 10/2006 |
| TW | I273536 | 2/2007 |

* cited by examiner

*Primary Examiner*—Thuy Vinh Tran
(74) *Attorney, Agent, or Firm*—Muncy, Geissler, Olds & Lowe, PLLC

(57) ABSTRACT

The present invention discloses an LED driver structure, which obtains input power coming from a power source to generate a constant-current power to drive a plurality of LEDs, and which comprises: a plurality of diode groups connected in parallel, a first piezoelectric conversion unit and a second piezoelectric conversion unit respectively arranged at both sides of the diode groups. The first and second piezoelectric conversion units receive the input power and opposite-phase convert the input power into driving powers to drive the diode groups. Among the plurality of diode groups, at least one diode group is formed of a plurality of LEDs. Each of the first and second piezoelectric conversion units has a piezoelectric inverter, which can easily achieve an impedance matching and a constant-current power to drive LEDs via a piezoelectric effect. Besides, the present invention also has the advantage of cost efficiency.

13 Claims, 5 Drawing Sheets

LED DRIVER STRUCTURE

FIELD OF THE INVENTION

The present invention relates to an LED driver structure, wherein a transformer unit cooperates with a push-pull driving circuit to generate driving power to drive an LED group.

BACKGROUND OF THE INVENTION

LED (Light Emitting Diode) has advantages of small size, long lifetime, low power consumption, and high light efficiency. With the development of various colors of LEDs, LED has extensively replaced traditional light sources and has been widely used in many illumination and display applications. Therefore, many semiconductor manufacturers pay their attention to the development of LED. Similar to a general diode, LED also has forward bias and reverse bias in electric operation. In forward bias, current can easily pass through LED; in reverse bias, almost none current pass through LED. Only forward bias can make LED emit light. Thus, only the positive semi-period of alternating current can drive LED to work. However, LED has a smaller reverse breakdown voltage than general diodes, and the negative semi-period of alternating current can easily puncture LED and may externally damage LED. Therefore, LED needs a special driving circuit, preferably a constant-current driving circuit. Taiwan patent No. M298538 disclosed a "Control Device for LED Vehicle Light", which comprises: a boost rectifier circuit, a driving IC and a plurality of LED lights. The driving IC controls the boost rectifier circuit and determines the current passing through LED lights. In the prior art, the LED lights are cascaded in the same direction, and the driving IC provides pulse signals to control the boost rectifier circuit to perform a switching type boosting, wherein the current is fluctuating and has a higher point and a lower point. Before reaching the higher point, the current has a stage unable to turn on LED. Further, the driving IC needs a circuit providing a constant voltage. Besides, the driving IC raises the cost of the LED light system. Therefore, the prior art is expensive but has an imperfect performance. Taiwan patent No. I273536 disclosed a "Light Source Circuit, Transformer Circuit, Light-Emitting Panel and Current Balance Method", wherein several sets of balancing transformers provide several balanced AC powers, and full-wave rectifier circuits transform the AC powers into fluctuating DC powers driving several sets of LED strings. However, the prior art has the disadvantages of non-constant current and high prices because it adopts full-wave rectification and uses at least one transformer. In conclusion, the conventional LED driving circuits still have the problems of non-constant current (fluctuating current) and high prices to overcome.

SUMMARY OF THE INVENTION

One objective of the present invention is to provide an LED driving circuit, which achieves a constant-current output and a lower price with fewer elements.

The present invention discloses an LED driver structure, which obtains input power coming from a power source to generate a constant-current power to drive a plurality of LEDs, and which comprises: a plurality of diode groups connected in parallel, a first piezoelectric conversion unit and a second piezoelectric conversion unit respectively arranged at both sides of the diode groups. The first and second piezoelectric conversion units receive the input power and opposite-phase convert the input power into driving powers to drive the diode groups. Among the plurality of diode groups, at least one diode group is formed of a plurality of LEDs. Each of the first and second piezoelectric conversion units has a piezoelectric inverter, which can easily achieve an impedance matching and a constant-current power via a piezoelectric effect to make the LEDs in the diode groups to emit light. The total driving power is the sum of the output powers of the first and second piezoelectric conversion units. The present invention replaces a single large-size and high-price power converter with two lower-price power converters to reduce the costs.

DETAILED DESCRIPTION OF THE PREFERRED EMBODIMENTS

Below, the technical contents of the present invention will be described in detail in cooperation with the drawings.

Figure 1:
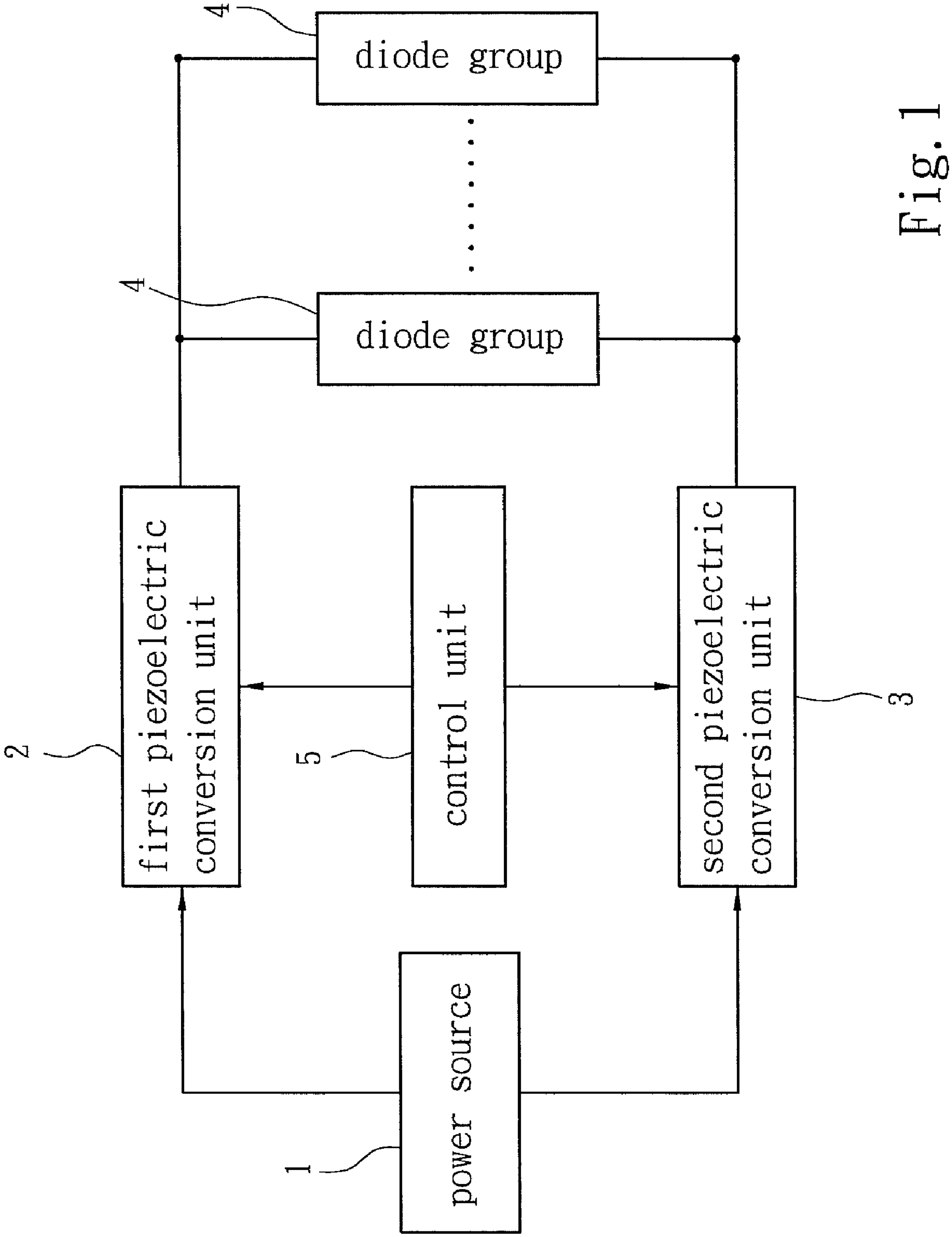
FIG. 1 is a block diagram schematically showing the fundamental architecture of the present invention.

Refer to FIG. 1, a block diagram schematically showing the fundamental architecture of the present invention. The present invention proposes an LED driver structure, which uses power coming from a power source 1 to generate a constant-current power to drive a plurality of LEDs 41 (shown from FIG. 2 to FIG. 4), and which comprises: a plurality of diode groups 4 connected in parallel, a first piezoelectric conversion unit 2 and a second piezoelectric conversion unit 3, which are respectively arranged at both sides of the diode groups 4. Each of the first and second piezoelectric conversion units 2 and 3 has at least one piezoelectric inverter. The present invention utilizes the advantage of the piezoelectric effect to provide a constant-current driving power. Among the plurality of diode groups 4, at least one diode group 4 is formed of a plurality of LEDs 41. The first and second piezoelectric conversion units 2 and 3 are connected to a control unit 5. The control unit 5 generates two opposite-phase control signals to respectively drive the first and second piezoelectric conversion units 2 and 3. The first and second piezoelectric conversion units 2 and 3 receive the input power and opposite-phase convert the input power into driving powers to drive the diode groups 4. As the first and second piezoelectric conversion units 2 and 3 operate in opposite phases, they form a push-pull circuit structure. The total driving power is the sum of the output powers of the first and second piezoelectric conversion units 2 and 3. When the first and second piezoelectric conversion units 2 and 3 have the same specification of piezoelectric inverters, the total driving power is the double of the output power of the first or second piezoelectric conversion unit 2 or 3. The present invention replaces the conventional single transformer with two lower-cost piezoelectric inverters to attain the advantages of lower electromagnetic noise, less waste heat, and higher efficiency.

Figure 2:
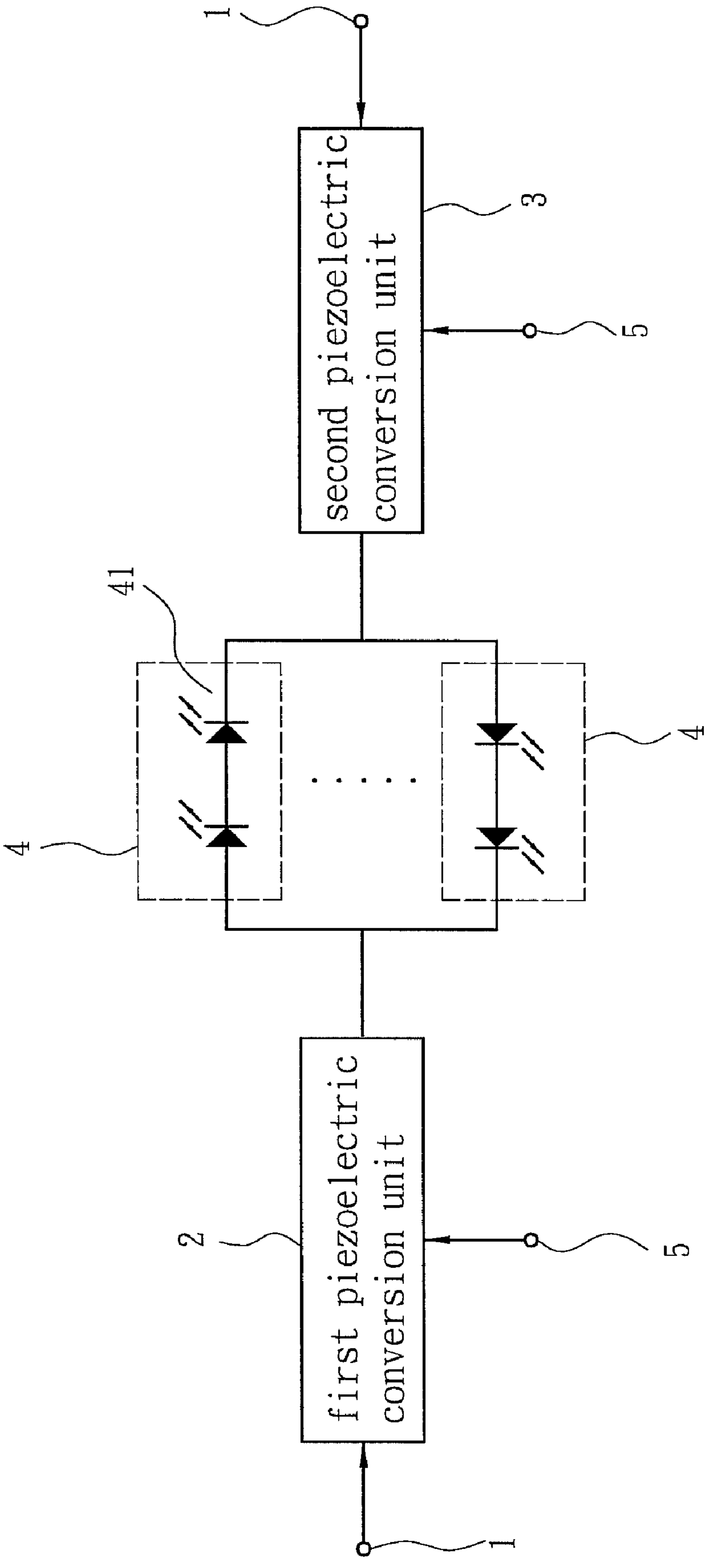
FIG. 2 is a diagram schematically showing a first embodiment of diode groups according to the present invention.
Figure 3:
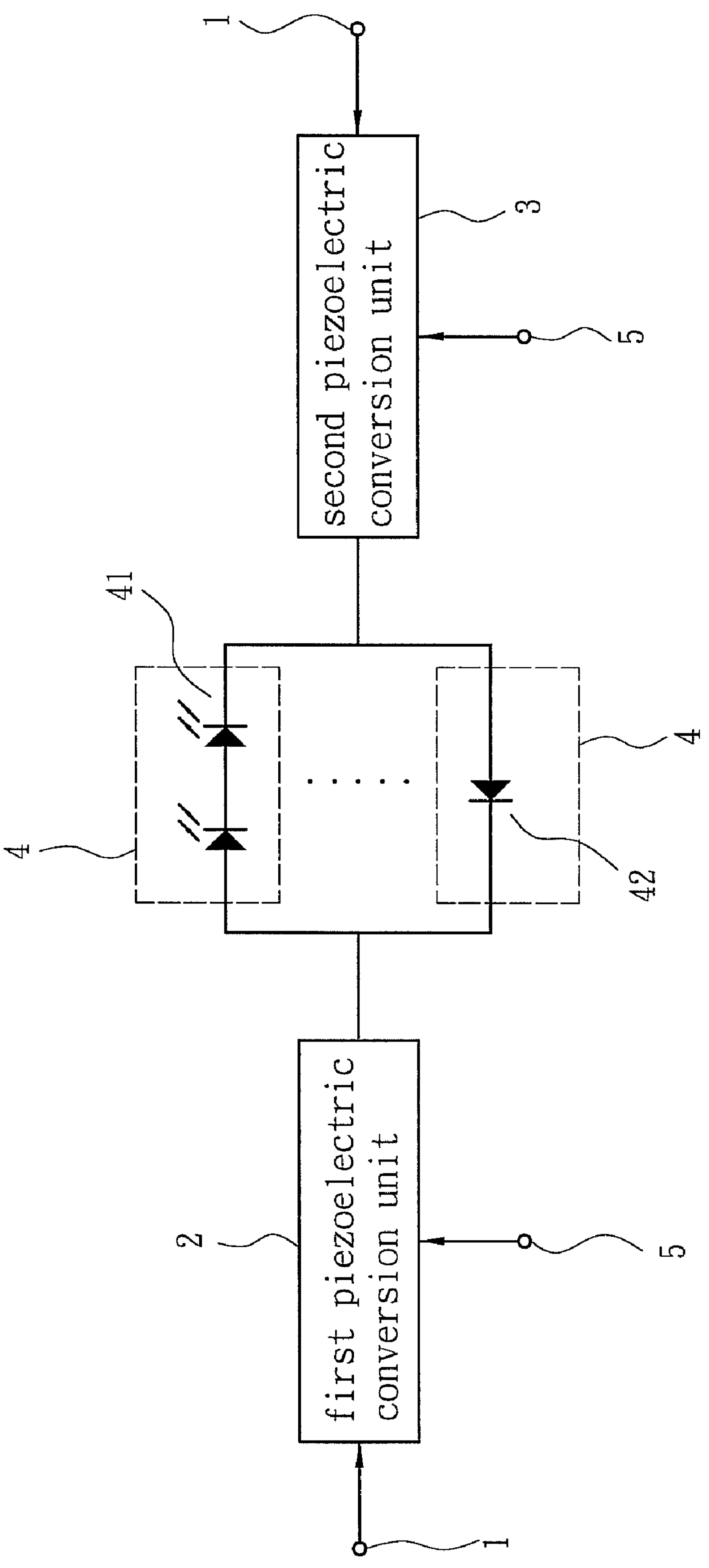
FIG. 3 is a diagram schematically showing a second embodiment of diode groups according to the present invention.
Figure 4:
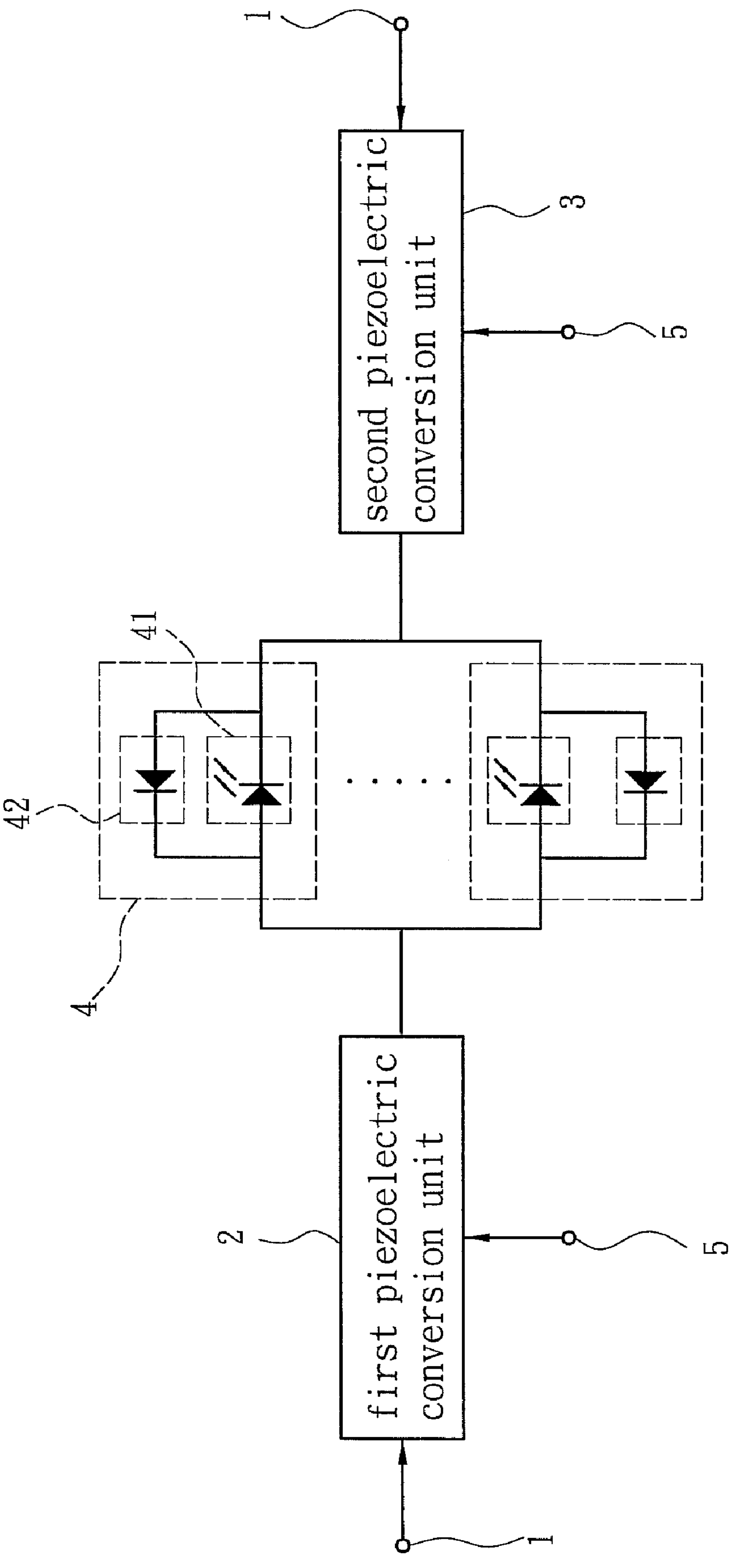
FIG. 4 is a diagram schematically showing a third embodiment of diode groups according to the present invention.

Refer to FIG. 2. The above-mentioned first and second piezoelectric conversion units 2 and 3 provide DC driving powers to drive diode groups 4 in opposite phases. The driving powers respectively drive diode groups 4, which are parallel connected in opposite directions, in the positive and negative semi-periods of each cycle. In this embodiment shown in FIG. 2, each diode group 4 has a plurality of cascaded LEDs 41, and one diode group 4 is parallel connected to the other diode group 4 in an opposite direction. Thus, the positive and negative semi-periods of the driving power alternatingly turn on the two diode groups 4. When the frequency of the driving power is high enough, the visual persistence makes human eyes feel that the two diode groups 4 are lighting simultaneously. Refer to FIG. 3. The plurality of diode groups 4 may include: a plurality of LEDs 41 arranged in the same forward-bias direction, and a diode 42 parallel connected to LEDs 41 and having a forward-bias direction opposite to that of LEDs 41. In this embodiment, the LEDs 41 are not limited to being connected in series but may also be cascaded and/or paralleled in the same forward-bias direction. Refer to FIG. 4. The diode groups 4 is a cascade assembly of several sets of LEDs 41 and diodes 42, wherein each LED 41 is connected in parallel to a neighboring diode 42 having a forward-bias direction opposite to that of the LED 41. Each diode group 4 may have several cascaded LEDs 41. The above-mentioned embodiments provide various combinations of LEDs 41 and diodes 42 for the diode groups 4. Further, the configuration that LEDs 41 and diodes 42 are arranged in opposite forward-bias directions makes both the positive and negative semi-periods of driving power able to pass easily and prevents the diode groups 4 from being damaged.

Figure 5:
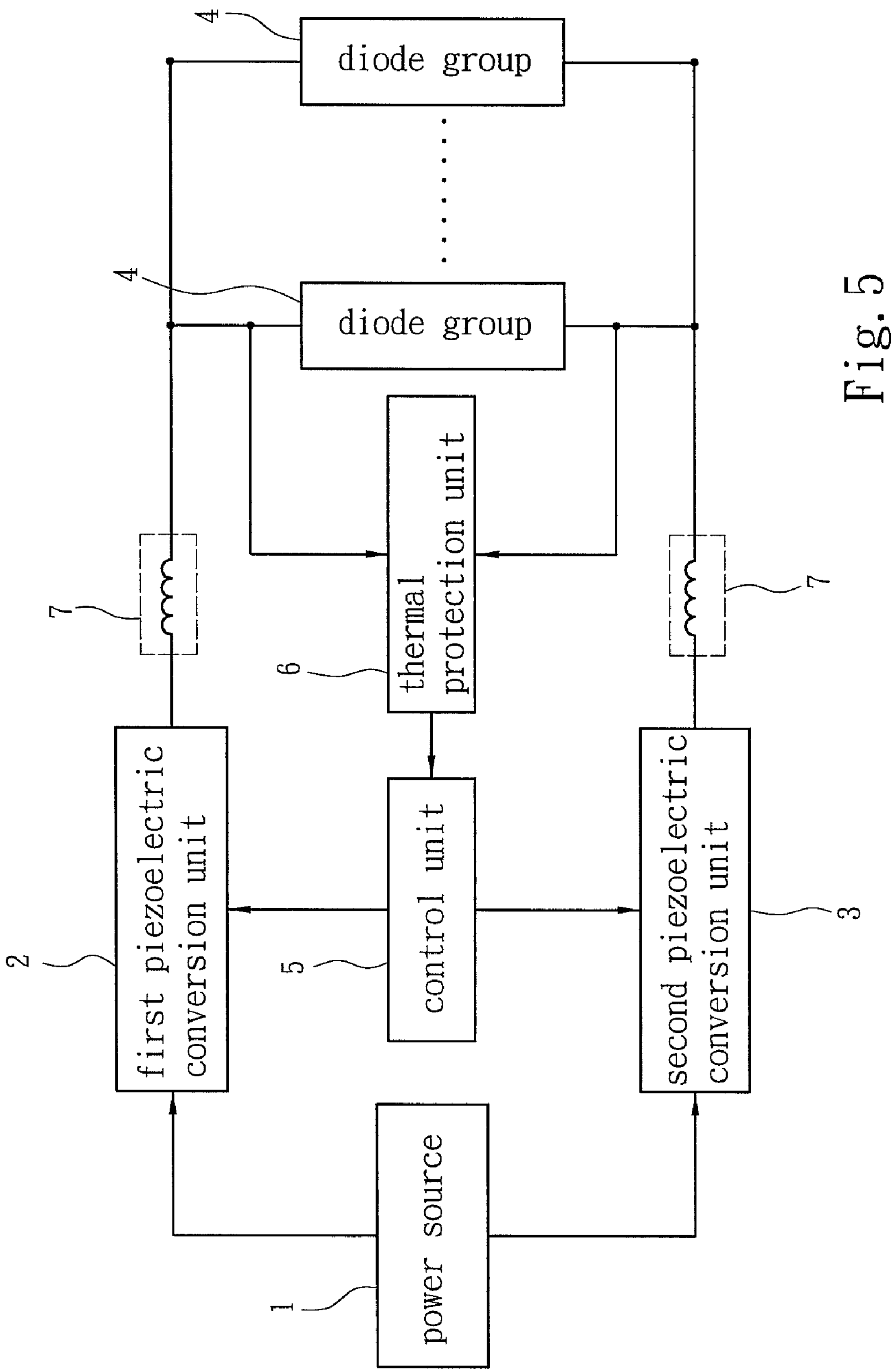
FIG. 5 is a block diagram schematically showing the architecture of a preferred embodiment according to the present invention.

Refer to FIG. 5, a block diagram schematically showing a preferred embodiment of the present invention. FIG. 5 is based on FIG. 1. However, the control unit 5 is connected to a thermal protection unit 6 bridging over the diode groups 4 in FIG. 5. The thermal protection unit 6 will send out an overheating protection signal to stop the operation of the control unit 5 when the diode groups 4 are overheated. Further, the diode groups 4 are cascaded to inductors 7 which modify the waveform of driving power to be closer to a square wave, whereby the fluctuation of current is reduced, and the non-conduction interval of the diode groups 4 is shortened. Thus, the efficiency of the diode groups 4 is promoted.

Alternatively, the first and second piezoelectric conversion units 2 and 3 may operate in the same timing, and the first and second piezoelectric conversion units 2 and 3 connect with the diode groups 4 in opposite polarities. Thus, the first and second piezoelectric conversion units 2 and 3 drive the diode groups 4 in opposite phases.

The preferred embodiments described above are only to exemplify the present invention but not to limit the scope of the present invention. Therefore, any equivalent modification or variation according to the spirit of the present invention is to be also included within the scope of the present invention, which is based on the claims stated below.

From the above description, it is proved that the present invention has improvements over the conventional technology, and that the present invention indeed possesses novelty and non-obviousness and meets the conditions for a patent. Thus, the inventor files the application for a patent. It will be appreciated if the application is approved fast.

What is claimed is:

1. An LED (Light Emitting Diode) driver structure, which obtains input power coming from a power source to generate a constant-current power to drive a plurality of LEDs, comprising:

a plurality of diode groups connected in parallel, wherein at least one said diode group is formed of a plurality of said LEDs;

a first piezoelectric conversion unit and a second piezoelectric conversion unit, both connected to said diode groups, both receiving said input power, and opposite-phase converting said input power into driving powers to drive said LEDs.

2. The LED driver structure according to claim 1, wherein each of said first and second piezoelectric conversion units has at least one piezoelectric inverter, which provides a constant-current driving power.

3. The LED driver structure according to claim 1, wherein said plurality of diode groups includes at least two diode groups connected in parallel in opposite forward-bias directions.

4. The LED driver structure according to claim 3, wherein each said diode group is a plurality of said LEDs connected in series.

5. The LED driver structure according to claim 4, wherein an inductor is cascaded to said diode group to modify a waveform of said driving power.

6. The LED driver structure according to claim 3, wherein each said diode group is a cascade assembly of LEDs and diodes connected in parallel, wherein said diode having a forward-bias direction opposite to said LED.

7. The LED driver structure according to claim 6, wherein an inductor is cascaded to said diode group to modify a waveform of said driving power.

8. The LED driver structure according to claim 1, wherein said plurality of diode groups includes: a plurality of said LEDs having the same forward-bias direction and a plurality of diodes connected to said LEDs in parallel and having a forward-bias direction opposite to that of said LEDs.

9. The LED driver structure according to claim 8, wherein an inductor is cascaded to said diode group to modify a waveform of said driving power.

10. The LED driver structure according to claim 1, farther comprising a control unit generating opposite-phase control signals to drive said first and second piezoelectric conversion units to operate in opposite phases.

11. The LED driver structure according to claim 10, wherein said control unit is connected to a thermal protection unit bridging over said diode groups and sending out an overheating protection signal to stop operation of said control unit according to the temperature of said diode groups.

12. The LED driver structure according to claim 1, further comprising a control unit generating control signals to drive said first and second piezoelectric conversion units, wherein said first and second piezoelectric conversion units are connected to said diode groups in opposite polarities and generate opposite-phase driving powers.

13. The LED driver structure according to claim 12, wherein said control unit is connected to a thermal protection unit bridging over said diode groups and sending out an overheating protection signal to stop operation of said control unit according to the temperature of said diode groups.

* * * * *